US010073141B2

(12) United States Patent
Wu et al.

(10) Patent No.: US 10,073,141 B2
(45) Date of Patent: Sep. 11, 2018

(54) DETECTING METHOD AND APPARATUS FOR ABNORMAL ELECTRICAL CONNECTION IN MAIN CIRCUIT OF SWITCHGEAR

(71) Applicant: EATON ELECTRICAL EQUIPMENT CO., LTD, Jiangsu (CN)

(72) Inventors: Fangji Wu, Shanghai (CN); Li Yu, Shanghai (CN); Jiong Chen, Shanghai (CN); Zuhui Li, Jiangsu (CN)

(73) Assignee: Eaton Electrical Equipment Co., Ltd. (CN)

( * ) Notice: Subject to any disclaimer, the term of this patent is extended or adjusted under 35 U.S.C. 154(b) by 0 days.

(21) Appl. No.: 15/329,193

(22) PCT Filed: Jul. 9, 2015

(86) PCT No.: PCT/CN2015/083663
§ 371 (c)(1),
(2) Date: Jan. 25, 2017

(87) PCT Pub. No.: WO2016/011897
PCT Pub. Date: Jan. 28, 2016

(65) Prior Publication Data
US 2017/0219653 A1    Aug. 3, 2017

(30) Foreign Application Priority Data

Jul. 25, 2014    (CN) .......................... 2014 1 0361681

(51) Int. Cl.
*G01R 31/327*    (2006.01)
*G01R 31/28*    (2006.01)
*G01R 31/333*    (2006.01)

(52) U.S. Cl.
CPC ....... *G01R 31/3275* (2013.01); *G01R 31/327* (2013.01); *G01R 31/3271* (2013.01); *G01R 31/28* (2013.01); *G01R 31/333* (2013.01)

(58) Field of Classification Search
CPC .... G01R 31/00; G01R 31/12; G01R 31/1227; G01R 31/1254; G01R 31/28;
(Continued)

(56) References Cited

U.S. PATENT DOCUMENTS 4,235,215 A * 11/1980 Stotz ..................... F02P 19/027
123/179.21
5,030,938 A * 7/1991 Bondzeit .............. B60Q 11/007
315/77

(Continued)

FOREIGN PATENT DOCUMENTS

| CN | 1442938 | 9/2003 |
|---|---|---|
| CN | 101813525 | 8/2010 |

(Continued)

OTHER PUBLICATIONS

International Search Report; corresponding to International Application No. PCT/CN2015/083663; dated Jul. 9, 2015; 2 Pages.

(Continued)

*Primary Examiner* — Hoai-An D Nguyen
(74) *Attorney, Agent, or Firm* — Ward and Smith, P.A.

(57) ABSTRACT

Resistance values for a first time for respective areas of a plurality of electrical connections are generated. Respective normalized resistance values are generated from the resistance values. Respective temperature rise values for a second time for respective ones of the areas of the electrical connections are generated. An average temperature value is generated from the temperature rise values. Respective normalized temperature rise values for the generated temperature rise values are generated based on the average
(Continued)

temperature values. An abnormal condition of at least one of the connections is detected responsive to the normalized temperature rise values and the normalized resistance values.

16 Claims, 3 Drawing Sheets

(58) Field of Classification Search
CPC ............ G01R 31/317; G01R 31/31703; G01R 31/3177; G01R 31/327; G01R 31/333; G01R 31/3271; G01R 31/3275
USPC ............... 324/415, 424, 200, 224, 500, 537, 324/750.01, 750.03, 600, 649, 691, 720, 324/721; 361/600, 601, 605
See application file for complete search history.

(56) References Cited

U.S. PATENT DOCUMENTS

| | | | | |
|---|---|---|---|---|
| 5,570,666 | A * | 11/1996 | Rymut | ............ F02P 19/02 123/145 A |
| 8,027,134 | B2 * | 9/2011 | Ziegler | ............ H01R 13/6666 361/600 |
| 2009/0239425 | A1 | 9/2009 | Sawada et al. | |
| 2011/0102190 | A1 * | 5/2011 | Vaidyanathan | ............ H04Q 9/00 340/870.17 |
| 2011/0181294 | A1 | 7/2011 | Ziegler | |
| 2017/0332980 | A1 * | 11/2017 | Fifield | ............ A61B 5/1101 |

FOREIGN PATENT DOCUMENTS

| | | |
|---|---|---|
| CN | 102243285 | 11/2011 |
| CN | 102798783 | 11/2012 |
| EP | 2 418 752 A1 | 2/2012 |
| JP | S6017067 | 4/1985 |
| WO | WO 2012/089573 A1 | 7/2012 |

OTHER PUBLICATIONS

Loucks, David, "A Step Closer Towards Maintenance Free Gear," Petroleum and Chemical Industry Conference (PCIC) Sep. 20, 2010, pp. 1-8.

Extended European Search Report, EP 15 82 5064.7, dated Apr. 3, 2018, 9 pages.

* cited by examiner

DETECTING METHOD AND APPARATUS FOR ABNORMAL ELECTRICAL CONNECTION IN MAIN CIRCUIT OF SWITCHGEAR

RELATED APPLICATIONS

The present application is a 35 U.S.C. § 371 national phase application of PCT International Application No. PCT/CN2015/083663, having an international filing date of Jul. 9, 2015, claiming priority to Chinese Patent Application No. 201410361681.4 filed Jul. 25, 2014. The disclosures of each application are incorporated herein by reference in their entireties. The above PCT International Application was published in the Chinese language as International Publication No. WO/2016/011897.

FIELD OF THE INVENTION

The present invention relates to a detecting method and a detecting apparatus for electrical connection, and particularly, to a detecting method and a detecting apparatus for abnormal electrical connection in a main circuit of switchgear.

BACKGROUND OF THE INVENTION

A switchgear is an electric device in a power transmission system, and can be used to turn on or off, control or protect electrical power system during power generation, transmission, distribution, conversion and consumption. A main circuit of switchgear is a part in an electrical control circuit through which a high current flows, and comprises electrical components connected between a power supply and a motor. As the operating time of the switchgear increases, the resistance value of electrical joint areas (e.g. contacts) in the main circuit of switchgear may increase due to mechanical shock, abrasion and manufacturing defects, which can make the temperature of the contacts increase or even burn the contacts, resulting in security incidents.

At present, at home and abroad, by measuring the temperature of a contact in the main circuit of switchgear using a temperature sensor, the electrical connection of the contact may be determined to be abnormal when the temperature of the contact exceeds a threshold value. However, since the current in the main circuit of switchgear is not constant, the temperature of the contact in the main circuit may vary under different currents. FIG. 1 is a temperature rising diagram of electrical connectors in a main circuit of switchgear under different currents. FIG. 1 shows the temperature rising values for the electrical connectors when currents in the main circuit are 500 A, 1250 A, 1375 A and 1500 A, wherein the first to fourth data with the same current indicate the temperature rising values for a joint area of an A-phase upper bus bar, an A-phase upper contact, an A-phase lower contact and a joint area of an A-phase lower bus bar respectively, the fifth to eighth data with the same current indicate the temperature rising values for a joint area of a B-phase upper bus bar, a B-phase upper contact, a B-phase lower contact and a joint area of a B-phase lower bus bar respectively, the ninth to twelfth data with the same current indicate the temperature rising values for a joint area of a C-phase upper bus bar, a C-phase upper contact, a C-phase lower contact and a joint area of a C-phase lower bus bar respectively.

It can be seen from FIG. 1 that the greater the current in the same electrical connector is, the greater the temperature rising value is. Since the temperature rising values for the electrical connectors in the main circuit of switchgear will change when the currents in the main circuit of switchgear change, it is impossible to accurately determine whether the electrical connection in the main circuit of switchgear is abnormal, which will cause misjudgment. In order to accurately determine whether the electrical connection is abnormal, the same electrical connector should have the same threshold value under different currents.

In addition, if an electrical connector in the main circuit of switchgear is loose and when the current in the main circuit is much lower than rated current in the main circuit, the temperature rising value of the electrical connector is lower than the temperature rising value under rated current. In this case, it is impossible to accurately determine whether the electrical connection of the electrical connector is abnormal.

SUMMARY OF THE INVENTION

According to the above-mentioned problems, an embodiment of the present invention provides a detecting method for abnormal electrical connection in a main circuit of switchgear, which includes the following steps:

acquiring a plurality of temperature rising values for measured areas of a plurality of electrical connectors in the main circuit of switchgear, the plurality of temperature rising values comprise a temperature rising value at a joint area of at least one of the electrical connectors;

calculating a weighted average temperature of the plurality of temperature rising values;

dividing each of the plurality of temperature rising values by the weighted average temperature to get normalized temperature rising values for the measured areas of the respective electrical connectors;

comparing each of the normalized temperature rising values for the measured areas of the electrical connectors with a corresponding one of normalized threshold values for the measured areas of the respective electrical connectors.

Preferably, the normalized threshold value for the measured area of the electrical connector is equal to the sum of a standard normalized resistance value of the measured area of the electrical connector and a tolerance thereof, and the standard normalized resistance value of the measured area of the electrical connector is equal to a standard resistance value of the measured area of the electrical connector divided by a weighted average resistance value of standard resistance values of the measured areas of the plurality of electrical connectors.

Preferably, the standard resistance value of the measured area of the electrical connector is a resistance value of the electrical connector when the electrical connection is normal.

Preferably, the tolerance is −20% to 20%.

Preferably, the detecting method further comprises acquiring a temperature rising value of a cabinet of the switchgear and comparing the temperature rising value of the cabinet with a temperature threshold value of the cabinet.

Preferably, the main circuit of switchgear comprises an A-phase circuit, a B-phase circuit and a C-phase circuit, and the measured areas of the plurality of electrical connectors comprise an A-phase upper contact, an A-phase lower contact, a B-phase upper contact, a B-phase lower contact, a C-phase upper contact and a C-phase lower contact.

Preferably, the measured areas of the plurality of electrical connectors further comprise a joint area of an A-phase upper bus bar, a joint area of an A-phase lower bus bar, a joint area of a B-phase upper bus bar, a joint area of a B-phase lower bus bar, a joint area of a C-phase upper bus bar and a joint area of a C-phase lower bus bar.

Preferably, the switchgear is a metal-enclosed switchgear.

An embodiment of the present invention provides a detecting apparatus for abnormal electrical connection in a main circuit of switchgear, which comprises:

A plurality of temperature acquiring devices for acquiring a plurality of temperature rising values for measured areas of a plurality of electrical connectors in the main circuit of switchgear, the plurality of temperature rising values comprise a temperature rising value at a joint area of at least one of the electrical connectors;

A weighted average temperature calculating device for calculating a weighted average temperature of the plurality of temperature rising values;

A normalized temperature rising value calculating device for dividing each of the plurality of temperature rising values by the weighted average temperature to get normalized temperature rising values for the measured areas of the respective electrical connectors;

A data comparing device for comparing each of the normalized temperature rising values for the measured areas of the electrical connectors with a corresponding one of normalized threshold values for the measured areas of the respective electrical connectors.

Preferably, the normalized threshold value for the measured area of the electrical connector is equal to the sum of a standard normalized resistance value of the measured area of the electrical connector and a tolerance thereof, and the standard normalized resistance value of the measured area of the electrical connector is equal to a standard resistance value of the measured area of the electrical connector divided by a weighted average resistance value of standard resistance values of the measured areas of the plurality of electrical connectors.

Preferably, the standard resistance value of the measured area of the electrical connector is a resistance value of the electrical connector when the electrical connection is normal.

Preferably, the tolerance is −20% to 20%.

Preferably, the detecting apparatus further comprises a cabinet temperature acquiring device for acquiring a temperature rising value of a cabinet of the switchgear and a cabinet temperature comparing device for comparing the temperature rising value of the cabinet with a temperature threshold value of the cabinet.

Preferably, the main circuit of switchgear comprises an A-phase circuit, a B-phase circuit and a C-phase circuit, and the measured areas of the plurality of electrical connectors comprise an A-phase upper contact, an A-phase lower contact, a B-phase upper contact, a B-phase lower contact, a C-phase upper contact and a C-phase lower contact.

Preferably, the measured areas of the plurality of electrical connectors further comprise a joint area of an A-phase upper bus bar, a joint area of an A-phase lower bus bar, a joint area of a B-phase upper bus bar, a joint area of a B-phase lower bus bar, a joint area of a C-phase upper bus bar and a joint area of a C-phase lower bus bar.

Preferably, the switchgear is a metal-enclosed switchgear.

The detecting method of the present invention can accurately determine whether electrical connection of the measured areas of the electrical connectors is abnormal under any electrical current and which electrical connection of measured areas is abnormal, with high convenience, safety and reliability.

BRIEF DESCRIPTION OF THE DRAWINGS

Below, embodiments of the present invention are described in more detail with reference to the attached drawings, wherein.

DETAILED DESCRIPTION OF THE INVENTION

In order to make the objects, technical solution and advantages of the present invention clearer, the present invention is further illustrated in detail by the specific embodiments with reference to the drawings. It should be understood that the specific embodiments described herein are used to explain the present invention and are not intended to limit the present invention. In order to describe conveniently, the measured areas of the electrical connectors hereinafter refer to areas where temperature rising values for the electrical connectors are detected by temperature acquiring devices.

The thermal power P generated in a circuit is represented by the equation (1) as follows:

$$P = K_f I^2 R \qquad (1)$$

where $K_f$ is the loss coefficient, I is the current in the circuit, R is the resistance value of the measured area of the electrical connector.

The temperature rising value τ for the measured area of the electrical connector is represented by the equation (2) as follows:

$$\tau = P/K_T A = K_f I^2 R / K_T A \qquad (2)$$

where $K_T$ is the dissipation coefficient, A is the effective dissipation area.

Assuming that N temperature sensors are utilized to measure temperature rising values for the measured areas of N electrical connectors under a certain current, the temperature rising value $\tau_i$ for the measured area of the i-th electrical connector is calculated as $\tau_i = K_f I^2 R_i / K_T A$, where $R_i$ is the resistance value of the measured area of the i-th electrical connector. The temperature rising value $\tau_i$ for the measured area of the i-th electrical connector is normalized by the average $\bar{\tau}$ of the temperature values for the measured areas of the N electrical connectors, and the normalized temperature rising value $\tau_i'$ for the measured area of the i-th electrical connector is represented by the equation (3) as follows:

$$\tau_i' = \tau_i / \bar{\tau} = N\tau_i / \Sigma_{i=1}^{N} \tau_i \qquad (3)$$

Figure 1:
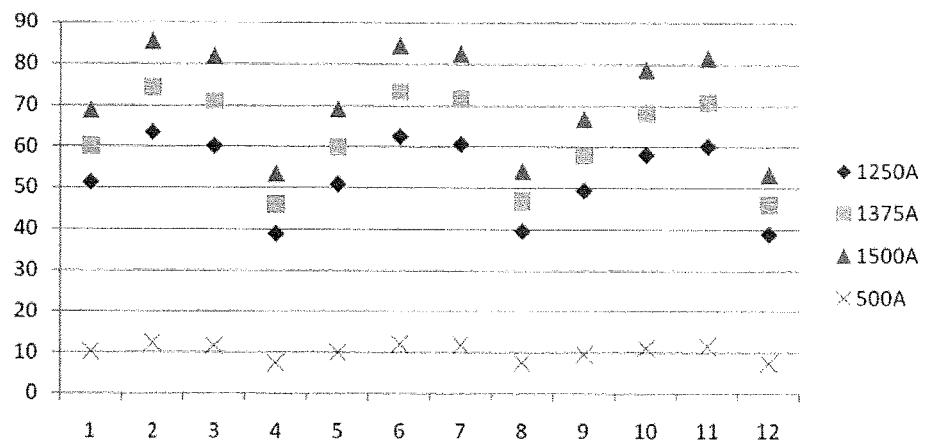
FIG. 1 is a temperature rising graph of electrical connectors in a main circuit of switchgear under different currents.
Figure 2:
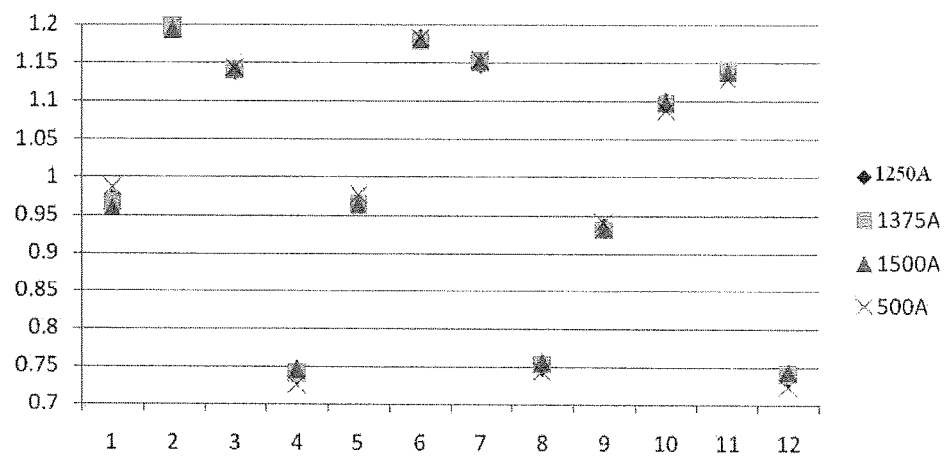
FIG. 2 is normalized temperature distributions of FIG. 1.

Since $K_f I^2 / K_T A$ is a constant, the following equation (4) can be obtained from the equation (3):

$$\tau_i' = \tau_i / \bar{\tau} = \frac{R_i}{\frac{1}{N}\sum_{i=1}^{N} R_i} = \frac{R_i}{\bar{R}} \qquad (4)$$

where $\bar{R}$ is the average of the resistance values of the measured areas of the N electrical connectors. It can be seen from the equation (4) that the normalized temperature rising value $\tau_i'$ for the measured area of the i-th electrical connector is equal to its normalized resistance value. That is to say, the normalized temperature rising value $\tau_i'$ is only related to the resistance value of the measured area of the i-th electrical connector and the average of the resistance values of the measured areas of the N electrical connectors, and is not relevant to the current or load in the circuit. FIG. 2 is normalized temperature distributions of FIG. 1. It can be seen from FIG. 2 that the normalized temperature rising values for the measured area of the same electrical connector are the same under different currents, if there is no temperature measurement error.

According to the above conclusions, the applicant measures the standard resistance values of the measured areas of a plurality of electrical connectors in a main circuit of switchgear which is qualified (i.e. it has normal electrical connection), calculates the average of the resistance values of the measured areas of the plurality of electrical connectors, divides the standard resistance value of the measured area of each electrical connector by the average resistance value to get a standard normalized resistance value of the electrical connector, i.e., obtain a standard normalized temperature rising value for the measured area of each electrical connector. The sum of the standard normalized resistance value of the electrical connector and a tolerance thereof may be set as a normalized threshold value for the measured area of the electrical connector. In an actual testing process, the tolerance can be chosen as needed. For example, a larger tolerance may be chosen when the electrical environment requires a relaxed electrical connection in the main circuit of switchgear, and a smaller tolerance may be chosen when the electrical environment requires very strict electrical connection.

In an embodiment of the present invention, the main circuit of switchgear has a three-phase circuit comprising an A-phase circuit, a B-phase circuit and a C-phase circuit. Each phase circuit has an upper bus bar, a lower bus bar, an upper contact and a lower contact. Twelve temperature rising values for a joint area of the upper bus bar, a joint area of the lower bus bar, the upper contact and the lower contact of the A-phase, B-phase and C-phase circuits are measured by twelve temperature sensors respectively. An average temperature value is obtained according to the twelve temperature rising values, and each temperature rising value is divided by the average temperature value to get a normalized temperature rising value for the measured area of each electrical connector, and each normalized temperature rising value may be compared with respective normalized threshold value. If the electrical connection of the joint area of the A-phase upper bus bar is abnormal, the temperature rising value at the joint area of the A-phase upper bus bar will increase, thereby the normalized temperature rising value at the joint area of the A-phase upper bus bar will increase, i.e., greater than the standard normalized resistance value. By setting a certain tolerance, if the normalized temperature rising value at the joint area of the A-phase upper bus bar is greater than its normalized threshold value, it can be determined that the electrical connection of the joint area of the A-phase upper bus bar is abnormal. The tolerance can be −20% to 20%. The larger the tolerance is, the greater the permissible degree of abnormal electrical connection is in the testing process. The smaller the tolerance is, the lower the permissible degree of abnormal electrical connection is in the testing process.

Figure 3:
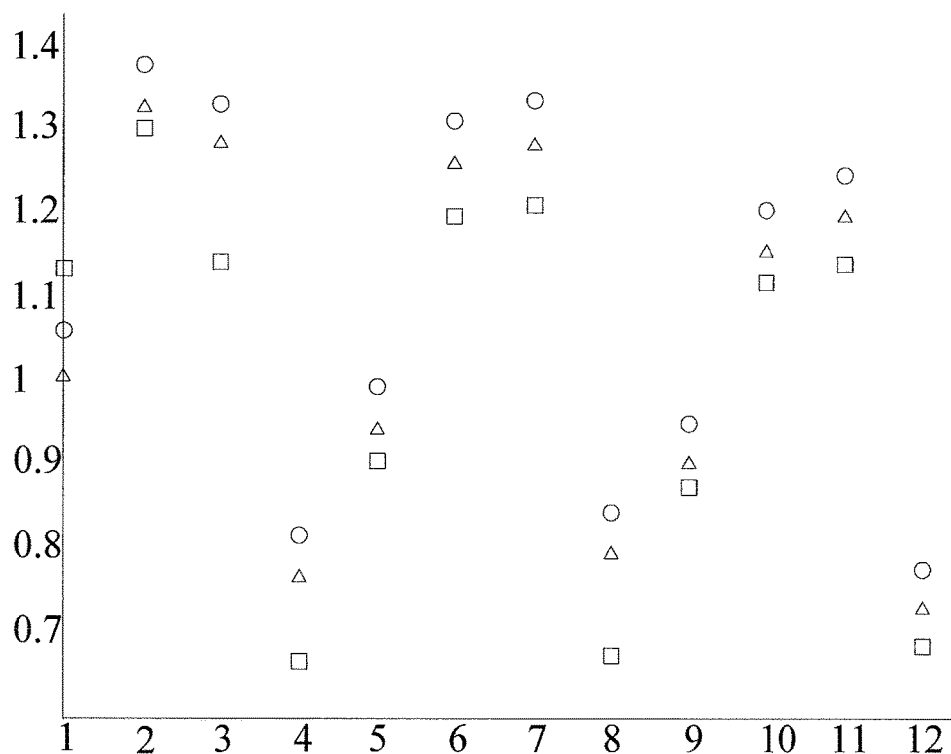
FIG. 3 is normalized temperature distributions of a main circuit of switchgear with an abnormal electrical connection.

In order to verify the effectiveness of the detecting method of the present invention, the current in the main circuit of switchgear is set to 1250 A, and we artificially destroy the electrical connection of the joint area of the A-phase upper bus bar of switchgear which was qualified. Twelve normalized temperature rising values at a joint area of the upper bus bar, a joint area of the lower bus bar, the upper contact and the lower contact of the A-phase, B-phase and C-phase circuits in the switchgear are obtained, and shown in FIG. 3 with small squares, wherein a data represented by the first small square is the normalized temperature rising value at the joint area of the A-phase upper bus bar. The data represented by twelve small circles in FIG. 3 are the normalized threshold values of the measured areas of each electrical connector respectively, and the data represented by twelve small triangles are the standard normalized resistance values of the measured areas of each electrical connector respectively. As you can see in FIG. 3, the normalized temperature rising value at the joint area of the A-phase upper bus bar is greater than the normalized threshold value of it, which indicates abnormal electrical connection in the joint area of the A-phase upper bus bar. Therefore, the detecting method of the present invention can accurately determine whether electrical connection in the main circuit of switchgear is abnormal.

In other embodiments of the present invention, the detecting method further comprises: measuring a temperature rising value of a cabinet of the switchgear and comparing the temperature rising value of the cabinet with a temperature threshold value of the cabinet, which is equal to the sum of the temperature rising value of the cabinet when the electrical connection of the main circuit of switchgear is normal and a tolerance thereof. In order to conveniently and accurately determine whether the electrical connection of the main circuit is abnormal, the cabinet of qualified switchgear may be measured to obtain the cabinet temperature threshold values corresponding to different currents in the main circuit. In an actual detecting process, when the temperature rising value of the cabinet exceeds cabinet temperature threshold value under the same current, we may conclude that the electrical connection of the main circuit in switchgear is abnormal.

The misjudgment for abnormal electrical connection can be avoided by measuring the temperature rising value of the cabinet or the ambient temperature inside the cabinet of switchgear. When the electrical connections of a plurality of or all of measured areas of the electrical connectors in the main circuit are abnormal, and in particular when the temperature rising values for all the measured areas increase by the same multiple, the normalized temperature rising value for the measured area of the electrical connector having abnormal electrical connection may remain unchanged. In this case, all the electrical connections in the main circuit will be misjudged as normal if only comparing the normalized temperature rising value for the measured area of the electrical connector with corresponding normalized threshold value. However, we can accurately determine that the electrical connection in the main circuit is abnormal by comparing the temperature rising value of the cabinet with the temperature threshold value of the cabinet under the same current.

In other embodiments of the present invention, a certain weighting coefficient may be assigned to the temperature rising value and/or the standard resistance value for the measured area of each electrical connector according to the importance of the measured area of the electrical connector. The weighted average temperature value and/or the weighted average resistance value are calculated according to the assigned weighting coefficients. A person skilled in the art will understand that the average of the twelve temperature rising values and the average of the resistance values of the measured areas of the twelve electrical connectors in the above described detecting method are only a special case with the same weighting coefficient. A person skilled in the art can select different weighting coefficients according to the actual detection requirements.

In other embodiments of the present invention, six temperature rising values of the upper contacts and lower contacts of the A-phase, B-phase and C-phase circuits are measured by six temperature sensors respectively. Then, the normalized temperature rising values are calculated and compared with the normalized threshold values respectively, so as to determine whether the electrical connections of the upper contacts and the lower contacts in the A-phase, B-phase and C-phase circuits are abnormal. In other embodiments, the detecting method further comprises measuring and calculating the normalized temperature rising values of other electrical connectors which are more prone to be abnormal in the main circuit of switchgear, comparing them with corresponding normalized threshold values, and determining whether the electrical connections of the electrical connectors are abnormal.

The detecting method of the present invention can determine whether the electrical connection of the main circuit in any existing switchgear (especially a metal-enclosed switchgear) is abnormal. When the change rate of the current in the main circuit of switchgear is low (e.g. lower than 100 A/s), the detecting method of the present invention can more accurately determine abnormal electrical connection in the main circuit.

According to an embodiment of the present invention, it also provides a detecting apparatus for abnormal electrical connection in a main circuit of switchgear, which comprises:

A plurality of temperature acquiring devices for acquiring a plurality of temperature rising values for measured areas of a plurality of electrical connectors in the main circuit of switchgear, the plurality of temperature rising values comprise a temperature rising value at a joint area of at least one of the electrical connectors;

A weighted average temperature calculating device for calculating a weighted average temperature of the plurality of temperature rising values;

A normalized temperature rising value calculating device for dividing each of the plurality of temperature rising values by the weighted average temperature to get normalized temperature rising values for the measured areas of the respective electrical connectors;

A data comparing device for comparing each of the normalized temperature rising values for the measured areas of the electrical connectors with a corresponding one of normalized threshold values for the measured areas of the respective electrical connectors.

Optionally, the normalized threshold value for the measured area of the electrical connector is equal to the sum of a standard normalized resistance value of the measured area of the electrical connector and a tolerance thereof, wherein the standard normalized resistance value of the measured area of the electrical connector is equal to a standard resistance value of the measured area of the electrical connector divided by a weighted average resistance value of standard resistance values of the measured areas of the plurality of electrical connectors.

Optionally, the standard resistance value of the measured area of the electrical connector is a resistance value of the electrical connector when the electrical connection is normal.

Optionally, the detecting apparatus further comprises a cabinet temperature acquiring device for acquiring a temperature rising value of a cabinet of the switchgear and a cabinet temperature comparing device for comparing the temperature rising value of the cabinet with a temperature threshold value of the cabinet.

Optionally, the main circuit of switchgear comprises an A-phase circuit, a B-phase circuit and a C-phase circuit, and the measured areas of the plurality of electrical connectors comprise an A-phase upper contact, an A-phase lower contact, a B-phase upper contact, a B-phase lower contact, a C-phase upper contact and a C-phase lower contact. Optionally, the measured areas of the plurality of electrical connectors further comprise a joint area of an A-phase upper bus bar, a joint area of an A-phase lower bus bar, a joint area of a B-phase upper bus bar, a joint area of a B-phase lower bus bar, a joint area of a C-phase upper bus bar and a joint area of a C-phase lower bus bar.

The temperature acquiring device of the present invention can be selected from existing temperature sensors configured to measure the temperature rising value for measured areas of the electrical connectors. The measured data may be transmitted by wireless communication, for example by using a transmitter and a receiver, to obtain the measured temperature rising value. The weighted average temperature calculating device may be a programmable logic device which can calculate a weighted average. The normalized temperature rising value calculating device may be a programmable logic device having the above mentioned function. The data comparing device may be a programmable logic device having the above mentioned function or a comparator.

Figure 4:
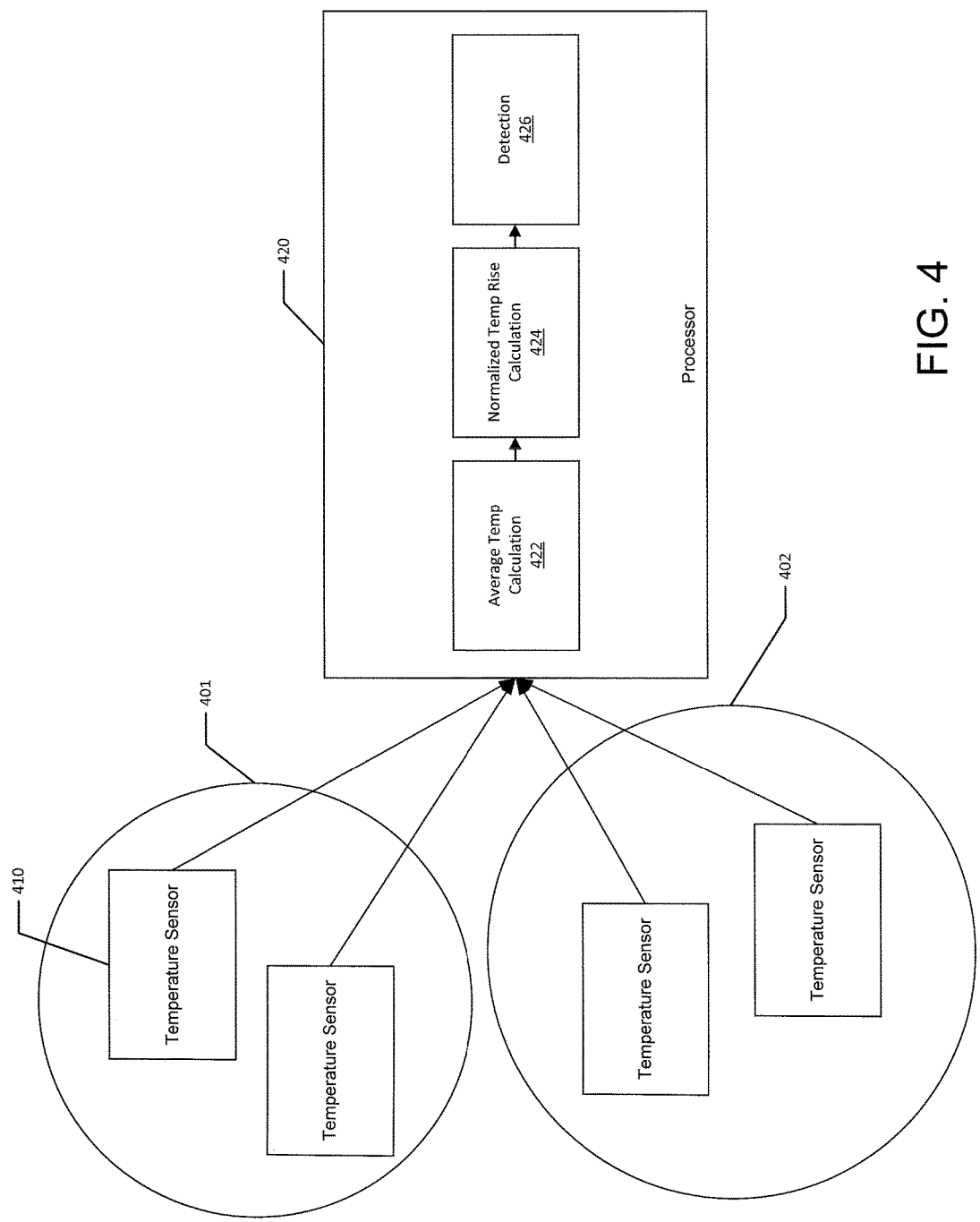
FIG. 4 illustrates an apparatus for detecting abnormal connections according to some embodiments.

FIG. 4 illustrates an apparatus for detecting abnormal connections. A plurality of temperature sensors 410 are used to generate temperature rise values for a plurality of areas of connections 401, 402 of a switchgear. A processor 420 is configured to implement an average temperature calculation device 422 that calculates an average temperature from the generated temperature rise values. A normalized temperature rise calculation device 424 generates normalized temperature rise values from the calculated average temperature and the generated temperature rise values. A detector device 424 compares the normalized temperature rise values to threshold values to detect an abnormality in one of the connections 401, 402.

Although the present invention has been described with preferred embodiments, but the present invention is not limited to the embodiments described herein, and comprises various modifications and alterations, without departing from the scope of the invention.

The invention claimed is:

1. A method of detecting an abnormal electrical connection in a switchgear, the method comprising:
   measuring respective resistance values for areas of respective electrical connections in the switchgear for a first state of the electrical connections;
   determining respective normalized resistance values from the measured resistance values;
   acquiring a plurality of temperature rising values for the areas of the electrical connections for a second state of the electrical connections, wherein the plurality of temperature rising values comprises a temperature rising value at a joint area of at least one of the electrical connections;
   calculating a weighted average temperature of the plurality of temperature rising values;

dividing respective ones of the plurality of temperature rising values by the weighted average temperature to get respective normalized temperature rising values for the areas of the respective electrical connections;

comparing the normalized temperature rising values for the areas of the electrical connections to the normalized resistance values; and detecting the abnormal connection responsive to the comparison.

2. The method according to claim 1, wherein detecting the abnormal connection comprises detecting the abnormal connection responsive to at least one of the normalized temperature rising values varying from at least one of the normalized resistance values by at least a tolerance.

3. The method according to claim 2, wherein measuring respective resistance values comprises measuring the respective resistance values for a first time and wherein acquiring plurality of temperature rising values comprises acquiring the temperature values for a second time.

4. The method according to claim 2, wherein the tolerance is −20% to 20%.

5. The method according to claim 1, further comprising acquiring a temperature rising value of a cabinet of the switchgear and comparing the temperature rising value of the cabinet with a temperature threshold value of the cabinet.

6. The method according to claim 1, wherein the switchgear comprises an A-phase circuit, a B-phase circuit and a C-phase circuit, and the areas of the electrical connections comprise an A-phase upper contact, an A-phase lower contact, a B-phase upper contact, a B-phase lower contact, a C-phase upper contact and a C-phase lower contact.

7. The method according to claim 6, wherein the areas of the electrical connections further comprise a joint area of an A-phase upper bus bar, a joint area of an A-phase lower bus bar, a joint area of a B-phase upper bus bar, a joint area of a B-phase lower bus bar, a joint area of a C-phase upper bus bar and a joint area of a C-phase lower bus bar.

8. The method of claim 3, wherein measuring the respective resistance values for a first time comprises measuring the first respective values for a time when a state of the electrical connections is known and wherein acquiring the temperature values for a second time comprises acquiring the temperature values at a second time when a state of the electrical connections is unknown.

9. An apparatus for detecting an abnormal electrical connection in a switchgear, the apparatus comprising:

a plurality of temperature acquiring devices configured to acquire a plurality of temperature rising values for areas of a plurality of electrical connections in the switchgear, the plurality of temperature rising values comprise a temperature rising value at a joint area of at least one of the electrical connections;

a weighted average temperature calculating device configured to calculate a weighted average temperature of the plurality of temperature rising values;

a normalized temperature rising value calculating device configured to divide respective ones of the plurality of temperature rising values by the weighted average temperature to get respective normalized temperature rising values for the areas of the respective electrical connections; and a detection device configured to compare the normalized temperature rising values for the areas of the electrical connections with normalized resistance values for the areas of the respective electrical connections and to detect the abnormal connection responsive to the comparison, wherein the normalized resistance values are for a first state of the electrical connections and wherein the acquired temperature rise values are for a second state of the electrical connections.

10. The apparatus according to claim 9, wherein wherein the detection device is configured to detect the abnormal connection responsive to at least one of the normalized temperature rising values varying from at least one of the normalized resistance values by at least a tolerance.

11. The apparatus according to claim 10, wherein the tolerance is −20% to 20%.

12. The apparatus according to claim 9, further comprising a cabinet temperature acquiring device for acquiring a temperature rising value of a cabinet of the switchgear and a cabinet temperature comparing device for comparing the temperature rising value of the cabinet with a temperature threshold value of the cabinet.

13. The apparatus according to claim 9, wherein the main circuit of switchgear comprises an A-phase circuit, a B-phase circuit and a C-phase circuit, and wherein the areas of the plurality of electrical connections comprise an A-phase upper contact, an A-phase lower contact, a B-phase upper contact, a B-phase lower contact, a C-phase upper contact and a C-phase lower contact.

14. The apparatus according to claim 13, wherein the areas of the plurality of electrical connections further comprise a joint area of an A-phase upper bus bar, a joint area of an A-phase lower bus bar, a joint area of a B-phase upper bus bar, a joint area of a B-phase lower bus bar, a joint area of a C-phase upper bus bar and a joint area of a C-phase lower bus bar.

15. A method comprising:

generating resistance values for a first time for respective areas of a plurality of electrical connections;

determining respective normalized resistance values from the resistance values;

generating respective temperature rise values for a second time for respective ones of the areas of the electrical connections;

generating an average temperature value from the temperature rise values;

generating respective normalized temperature rise values for the generated temperature rise values based on the average temperature values; and detecting an abnormal condition of at least one of the connections responsive to the normalized temperature rise values and the normalized resistance values.

16. The method of claim 15, wherein detecting an abnormal condition of at least one of the connections responsive to the normalized temperature rise values and the normalized resistance values comprises detecting an abnormal condition responsive to a comparison of at least one of the normalized temperature rise values to at least one threshold corresponding to at least one of the normalized resistance values plus or minus a tolerance.

* * * * *